United States Patent [19]

Kokkosoulis et al.

[11] Patent Number: 5,443,390
[45] Date of Patent: Aug. 22, 1995

[54] COMPUTER AUDIO JOYSTICK AND MIDI BREAKOUT BOX

[75] Inventors: George D. Kokkosoulis; Jorge E. Muyshondt, both of Austin; Bruce J. Wilkie, Georgetown, all of Tex.

[73] Assignee: International Business Machines, Corp., Armonk, N.Y.

[21] Appl. No.: 92,313

[22] Filed: Jul. 14, 1993

[51] Int. Cl.$^6$ .................. H01R 27/00; H05K 9/00
[52] U.S. Cl. .................. 439/76.1; 174/35 C; 439/650
[58] Field of Search .............. 439/76, 502, 638, 607, 439/650–654; 174/35 R, 35 C

[56] References Cited

U.S. PATENT DOCUMENTS

| | | | |
|---|---|---|---|
| 3,325,766 | 1/1967 | Kolb et al. | 439/43 |
| 4,469,330 | 9/1984 | Asher | 273/148 B |
| 4,613,139 | 9/1986 | Robinson, II | 273/148 B |
| 4,777,857 | 10/1988 | Stewart | 84/1.01 |
| 4,877,966 | 12/1989 | Gellerman | 434/45 |
| 4,922,056 | 5/1990 | Larsson | 174/65 R |
| 4,924,216 | 5/1990 | Leung | 340/709 |
| 5,030,128 | 7/1991 | Herron et al. | 439/352 |
| 5,048,409 | 9/1991 | Schulz | 100/48 |
| 5,064,388 | 11/1991 | Paladel | 439/607 |
| 5,088,928 | 2/1992 | Chan | 434/339 |
| 5,107,404 | 4/1992 | Tam | 361/818 |
| 5,121,491 | 6/1992 | Sloan et al. | 395/500 |
| 5,121,667 | 6/1992 | Emery et al. | 84/603 |
| 5,130,893 | 7/1992 | Straate et al. | 439/49 |
| 5,134,395 | 7/1992 | Stern | 341/20 |
| 5,177,665 | 1/1993 | Frank et al. | 439/502 |
| 5,192,226 | 3/1993 | Wang | 439/502 |
| 5,213,327 | 5/1993 | Kitaue | 273/148 B |
| 5,244,397 | 9/1993 | Anhalt | 439/101 |

FOREIGN PATENT DOCUMENTS

| | | | |
|---|---|---|---|
| 9302483 | 6/1993 | European Pat. Off. | |
| 2-288176 | 11/1990 | Japan | 439/502 |

OTHER PUBLICATIONS

Selbstist der Musiker Midi Interface, Wurzburg, DE, Aug., 1992, No. 8. Pp. 250–251.

Primary Examiner—Neil Abrams
Attorney, Agent, or Firm—Laurence R. Letson

[57] ABSTRACT

A MIDI/joystick breakout box is described which incorporates a shielded connector, a shielded cable, and a terminal block including a circuit board with an extensive ground plane surrounding the joystick connections and shielding the MIDI circuitry on at least three sides. The terminal block is a housing which acts as a radiation shield. The housing or terminal block may be made of an injected molded plastic material containing electrically conductive strands of metal or the housing may be plated or painted on its interior surfaces with an electrically conductive material to form a shielding layer which may then be further connected to the ground plane of the electronic circuit board contained within the terminal block housing. The terminal block provides connectors for MIDI-In, MIDI-Out MIDI-Thru and a pair of joystick interface connectors which allows the capability to connect both MIDI devices and two joysticks to the audio adapter card simultaneously.

15 Claims, 3 Drawing Sheets

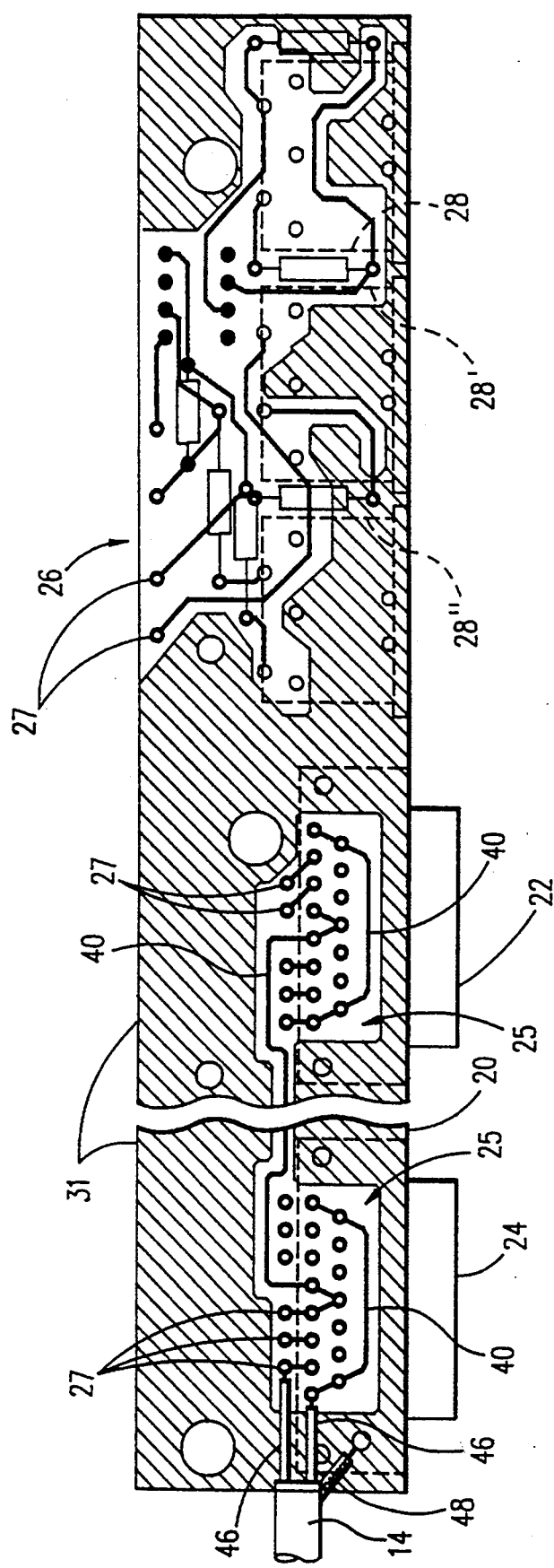

COMPUTER AUDIO JOYSTICK AND MIDI BREAKOUT BOX

FIELD OF THE INVENTION

This invention relates to the connection of MIDI devices and joysticks to a computer and, more specifically, to a breakout box for accomplishing the connection.

BACKGROUND OF THE INVENTION

The need to interface a computer with a multitude of various external audio devices has increased dramatically with the advent of computer based audio products. These computer based audio products include a wide range of applications which can be further divided into several distinct categories, such as entertainment audio i.e., games and animation; educational audio, i.e., reading and writing tutors; training audio for use in commercial training programs; and, merchandising audio for presentations and sales.

The primary use of audio adapters to date occurs in the category of entertainment audio with computer game audio capturing the largest market share by far. Audio products in the computer based games market include SoundBlaster TM computer audio adapters, available from Creative Labs, Inc., of Milpitas, California. Other audio adapter cards are available from Mediavision of Fremont, Calif.

As the different types of connections to audio adapter cards, including interfaces for microphones, headphones, Musical Instrument Device Interface (MIDI) devices, CD-ROM drives, joysticks, etc., multiply in number, interface connections are constrained by the very limited mechanical space available for external device connectors on the back of IBM PC compatible computer adapter cards.

The industry has turned to external breakout cables to overcome this very limited space constraint. Generally, external breakout devices comprise one computer card which have an external rear connector of high pin density and low mechanical profile. A corresponding high pin density external connector attached to a multi-conductor cable plugs into the rear external computer audio adapter connector. The multi-conductor cable fans out the different electrical signals into several discrete and distinct industry standard connectors.

One very common computer game audio adapter card rear connector definition comprises a 15 pin D-Shell which is the mechanical and electrical standard for both MIDI and game joysticks. Although many manufacturers offer breakout cables for this connector, these breakout cables have several common shortcomings.

One shortcoming is the cost associated with the hardware needed to meet a published interface specification for the MIDI 1.0 specification and the IBM PC Game Port Specification.

Another shortcoming is the failure to comply with emissions regulations as prescribed by the Federal Communications Commission (FCC) Class B for electronic products used in the household. Many, if not most, computer game audio card manufacturers circumvent the requirement for the FCC Class B regulation. Computer game audio adapter manufacturers provide assembly schematics for their respective breakout cables directly to the consumer. The consumer is expected to assemble his own cable; because it is constructed by the consumer for personal use, the FCC Class regulation does not apply.

A further shortcoming of currently available breakout cables is the need for additional breakout connectors to support a dual joystick operation for use with compatible games having musical outputs.

Still another shortcoming of currently available breakout cables is the need for additional hardware to support not only a MIDI-In and a MIDI-Out interface, but also a MIDI-Thru interface.

The present invention is an improved breakout cable for interfacing to computer audio adapters which support both game port interfaces and MIDI connections.

SUMMARY OF THE INVENTION

Accordingly, it is an object of the present invention to provide a low cost computer audio adapter breakout device that supports both game port interfaces for joysticks and MIDI connections.

It is also an object of this present invention to provide a computer audio adapter breakout device that complies with the FCC Class B requirements.

It is yet another object of this present invention to provide a computer audio adapter breakout device that facilitates the connection of multiple joysticks.

It is still another object of this present invention to provide a computer audio adapter breakout device that facilitates the connection of MIDI-In, MIDI-Out and MIDI-Thru devices.

Lastly, but not limited hereto, it is an object of the present invention to extend and promote design and manufacture of audio cable breakout boxes.

A more detailed understanding of the invention may be gained from the drawings and detailed description of the invention to follow.

IN THE DRAWINGS

FIG. 3 is a representation of the circuit board and circuitry contained on said electronic circuit board of the breakout box.

DETAILED DESCRIPTION OF THE PREFERRED EMBODIMENT OF THE BEST MODE CONTEMPLATED BY THE INVENTORS FOR CARRYING OUT THE INVENTION

Figure 1:
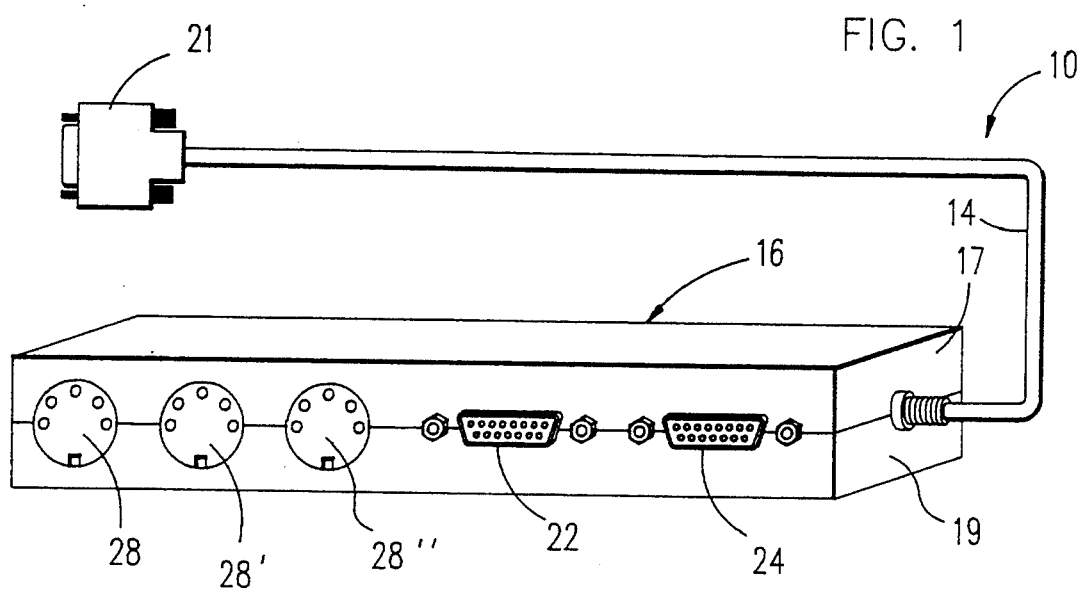
FIG. 1 illustrates the computer audio/joystick and MIDI breakout box.

Referring to FIG. 1, the breakout cable assembly 10 is illustrated. The breakout cable assembly 10 comprises a standard pin density shielded fifteen pin connector 21 referred to commonly in the industry as a fifteen pin D connector. Connector 21 is selected to be compatible with a similarly standard pin density D socket located on an audio adapter card (not shown) installed in a computer. Such audio adapter cards are available from Mediavision of Fremont, California or from Creative Labs of Milpitas, Calif. and others. Both audio adapter cards embody, with minor alteration, the IBM P.C. Game Port, Specification. The alterations eliminate a redundant +5 volt line on pin twelve, as well as a redundant ground connection on pin fifteen of connector 21 and the substitution, therefore, of a MIDI-In and a MIDI-Out signal on pins fifteen and twelve, respectively, which will be more fully described and discussed below. Shielded connector 21 is joined to shielded cable 14 which carries fifteen conductors 46 as shown in FIG. 3, and a foil wrapping and/or copper braid 48 which extends around and provides shielding to the conductors 46. Cable 14 is passed into the terminal block 16 and the conductors 46 of cable 14 and the shielding foil or braid 48 are connected to the internal connection points on circuit board 20 and the ground plane 31 of circuit board 20 illustrated in FIG. 3.

Circuit board 30 of FIG. 3 is similarly connected to joystick interface connection sockets 22, 24 for the attachment of a pair of joysticks (not shown). Further, circuit board 20 is connected to three connectors 28, 28' and 28" which provide the plugging capability for MIDI devices such as keyboards to be connected to the cable assembly 10. The connectors 28, 28', 28" respectively provide signals referred to as MIDI-In, MIDI-Out and MIDI-Thru. The MIDI 1.0 specification, published by International MIDI Association, is embodied in the wiring of the connectors 28, 28' and 28" and through the circuit board 20, MIDI circuitry 26 as seen in FIG. 3.

Referring again to FIG. 2, two joystick interface connectors 22, 24 are schematically illustrated. The connectors 22, 24 are connected to connector 21. The signals on connector 21 are identified as follows: +5 volts is the regulated 5 volt operating voltage supplied to the joystick interfaces 22, 24 on pins one and nine and to the MIDI circuits 30, 32, 34 on pin eight. The AB1 signal on pin two is the signal from the A joystick, button 1, while the AX signal is the voltage representing the X component of movement of joystick A and is present on pin three. Ground is provided to the two joysticks interfaces 22, 24 on pin four and to the MIDI-In circuit 30 by pin five. The AY signal on pin six is a varying voltage representing the Y component of movement of joystick A.

Continuing in connector 21, AB2 on pin seven is the signal from the A joystick, button 2. Similarly, the BB1 signal on pin ten and BB2 signal on pin fourteen represent the signals from buttons 1 and 2, respectively, of joystick B. The signals BX present on pin eleven and BY found on pin thirteen are the variable voltage signals representing the movement of the B joystick in the X and Y directions, respectively.

Figure 2:
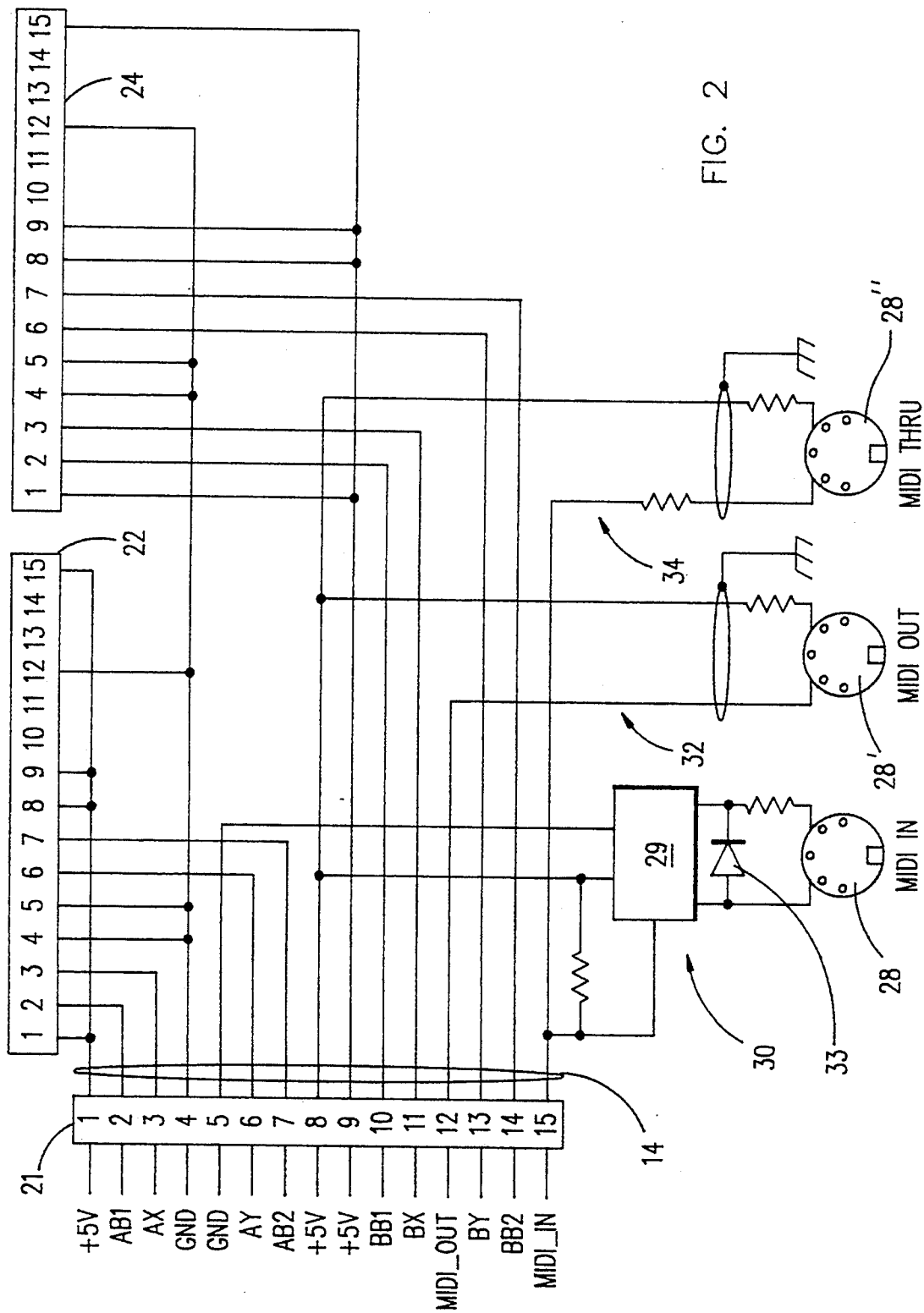
FIG. 2 is a circuit diagram illustrating the electrical circuits contained within the breakout box, together with cable and joystick interfaces.

Additionally on connector 21, the MIDI-In signal is provided to the MIDI-In circuitry 30 and MIDI-Thru circuitry 34 on pin fifteen of connector 21 while the MIDI-Out signals from the MIDI-Out circuitry 32 are present on pin twelve. The MIDI-In circuitry is comprised of a opto-isolator 29 and a diode 33 to avoid ground loops and subsequent data errors. The transmitting circuitry (for example, a keyboard) and receiver circuitry (computer) are internally separated by an opto-isolator 29 such as a Hewlett Packard 6N139 opto-isolator module. The opto-isolator 29 is a light emitting diode and photo sensor in a single package. The diode 33 provides further overshoot protection between the MIDI-In connector 28 and the computer to which the breakout box assembly 10 is attached. The circuit of FIG. 2 is a physical embodiment of the IBM P.C. Game Port Specification and MIDI 1.0 specification with the signals on connector pins twelve, twenty-one and fifteen altered from the IBM P.C. Game Port Specification to accommodate the MIDI 1.0 specification requirements.

An essential aspect of the breakout box device 10 is compliance with the Federal Communications Commission Class B Emissions Standards. The breakout device circuit board 20 is provided with a substantial ground plane 31 on the circuit board 20 surface or within the board 20.

The terminal block 16 and circuit board 20 are provided with three identical connectors 28, 28' and 28" for the MIDI connections. The MIDI-In connectors 28 provide ports for attaching devices such as electronic keyboards. The MIDI-Out connector 28' will accommodate the attachment of devices such as keyboards or synthesizers which receive and utilize the MIDI signal from the audio adapter card (not shown) to generate audio and musical output. The MIDI-Thru connector 28" is provided to permit the connection of additional MIDI devices which are capable of receiving MIDI signals from the computer provided from the MIDI end connector. The addition of the MIDI-Thru connector 28" and associated circuitry 34 permits the connection of additional MIDI devices and does not limit the number of MIDI devices which may be connected to the computer, as some MIDI interface devices do, where they only contain connectors which are comparable to the MIDI-In connector 28 and MIDI-Out connector 28'.

The ground plane 31 of circuit board 20 completely surrounds the circuitry 25 connecting the terminal points 27 of circuit board 20 to the connectors 22, 24. The circuit lands 40 of circuit board 20 are laid out only to include turns which are not sharp 90° angle turns in order to minimize reflections of electrical signals due to the sharp 90° turns in the pattern of lands 40. The MIDI circuitry 26 for the MIDI-In, MIDI-Out and MIDI-Thru functions is substantially surrounded on at least three sides of the circuitry layout 26. The ideal condition would be to completely surround the circuitry 26. However, judicious placement of the ground plane 31 around the circuitry 26 on three sides significantly reduces radiated emissions.

Additionally the circuit lands 40 are made as wide as possible to reduce the inductance which minimizes the radio frequency interference (RFI) and the electromagnetic interference (EMI).

As can be seen in FIG. 3, the shielding layout of the ground plane 31 is designed so that all corners forming right angles are altered whereby the transition around the right angles is either radiused or the transition is made through at least two corners, but at angles other than 90°.

As observable in FIG. 3, the ground plane 31 completely separates the MIDI circuitry 26 and the circuitry 25 connecting the terminal points 27 of circuit board 20 to the joystick interface connectors 22, 24, thereby reducing electrical crosstalk between the joystick interfaces 22, 24 and the MIDI circuitry 26.

The circuit board 20 is connected to individual conductors 46 within cable 14. Only two conductors 46, along with shielding foil 48 are illustrated in FIG. 3, but others are connected to the appropriate contacts for the MIDI circuitry 26 and joystick connectors 22, 24 as defined by the circuit diagram in FIG. 2.

The entire circuit board 20 and the termination points 27 of the individual conductors 46 and shielding foil or braid 48 as illustrated in FIG. 3 are contained within terminal block 16 as seen in FIG. 1. Terminal block 16 comprises a pair of shells 17, 19 when closed which will enclose all of the circuit board 20, the end of cable 14, and connectors 22, 24, 28, 28' and 28". This leaves only the interface portion of the connectors exposed. Connectors 22, 24 will protrude from the enclosure of block 16 to permit mating with the shielded connectors on the joystick assemblies (not shown). Connectors 28, 28', 28" are disposed so that the plugging faces thereof are flush with the exterior of terminal block 16.

To further suppress the RFI and EMI radiation, the terminal block shells 17, 19 are fabricated of injected molded plastic. The plastic may be loaded with metal fibers or strands. The strands or fibers of metal touch each other and form a random grounding and shielding network of conductors which act to shield against the emission of the RFI. Alternatively, the plastic shells 17, 19 may be painted or plated with conductive material on the interior surfaces 62 thereof as viewable in FIG. 4. A metal container may be substituted for the plastic shells 17, 19.

Figure 4:
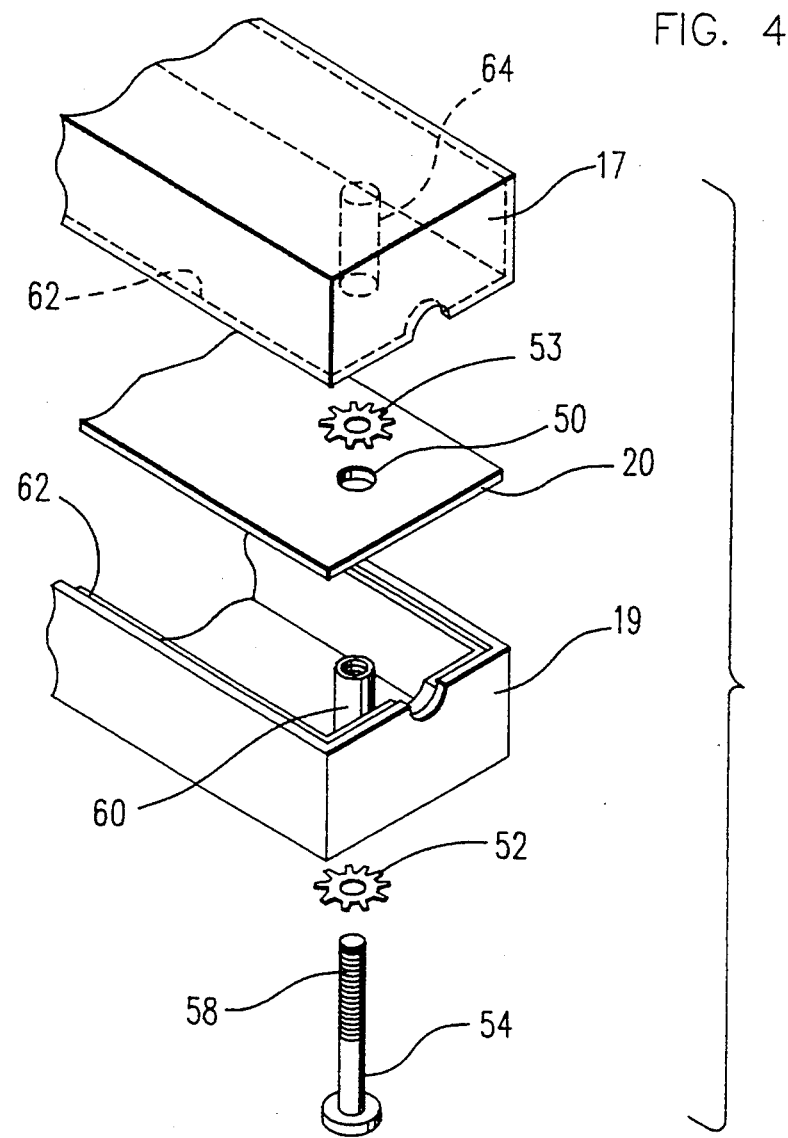
FIG. 4 is a partial exploded view of the breakout box and its components.

Referring to FIG. 4, the elements of the terminal block 16 are illustrated in an exploded view to provide a better understanding of the grounding of shell 17, 19. Terminal block 16 is electrically connected to the ground plane 31 of circuit board 20 by the use of screws 54. Each shell 17, 19 having been molded of metal strand impregnated plastics or alternatively coated interiorly with electrically conductive paint or plated on the interior 62 surface thereof, are formed with a hollow standoffs 64, 60. The inside diameter of standoffs 60 is such as to permit the passage of screw 54 or to engage the threads 58 of screw 54.

Positioned intermediate to the head of screw 54 and shell 19 is star washer 52 which acts to cut into the plastic and to engage the metal strands while at the same time to engage the head of screw 54. Further, star washer 53 is disposed between shell 17 and ground plane 32 of board 20, specifically, between board 20 and the stand off 64 in shell 17. Star washer 53 establishes reliable electrical contact between the shells 17, 19 and the electronic circuit board 20. Screw 54 passes through hole 50 in circuit board 20.

Since the shells 17 and 19 enclose circuit board 20 at the unshielded region of board 20, near one side of the MIDI circuitry 26, radiation emitted from the circuit board 20 at that region is trapped by the shells of 17 and 19 of the enclosure or terminal block 16. Once trapped by the electrically conductive material either in or on the interior 62 of shells 17 and 19, the radiation is then conducted to and grounded onto the ground plane 31 of circuit board 20.

The effective shielding of the printed circuit board 20, together with the individual conductors 46 of cable 14, is important because the complete assemblies 10 must comply with the Federal Communications Commission Class B Standards for radiation emissions. It is extremely important to suppress the RFI over a broad spectrum of frequencies. Because the audio adapter boards sold by various manufacturers may be used on a variety of computers with a variety of operational speeds or clock frequencies built into the computers, it is important that the shielding approach be effective to suppress RFI over a broad spectrum of RFI frequencies. A typical computer will include a system clock, video clock, bus clock, and possibly adapter board clocks, each operating at different frequencies and their harmonics. Accordingly, there will be several frequencies of potentially radiated emissions emanating from a single computer. These various clock frequencies result in a very broad spectrum of radio frequency interference which must be captured and contained by the shielding of the MIDI/joystick breakout box. The suppression of RFI over a broad spectrum of frequencies permits the MIDI/joystick breakout box to be successfully attached to a broad array of computers, any of which may be provided with an audio adapter board, yet, which still meet the Federal Communications Commission Class B standards for radiated emissions.

As one of skill in the art will appreciate, the clock frequencies generated on the conductors within a computer will tend to radiate throughout the computer and will be contained by the shielding inherent in the structure of the computer. However, when unshielded devices are attached at the interface ports of the computer or at the interface ports of adapter boards attached to the computer, the clock frequencies will propagate through the connectors to the unshielded attachments and thereby be radiated much like signals being radiated by an antenna.

With the invention described herein, the propagation of the clock frequencies into the cabling and terminal block of the MIDI/joystick breakout box will be shielded and suppressed to the extent necessary to insure compliance with the Federal Communications Commission Class B Emitted Radiation Standards.

Those skilled in the art would understand that the principals of the invention could be expanded to other types of signals other than joystick and MIDI signals. For example, the present invention could be used in a parallel port splitter a multiple display splitter breakout devices which separate analog input audio inputs and outputs and digital video.

While at least the preferred embodiment of the best mode contemplated by the inventors is disclosed and described, those skilled in the art will understand that changes may be made to the described embodiments without removing the audio adapter card breakout box from the scope of the claims attached hereto.

We claim:

1. An interface device for connecting computer audio adapters to MIDI compatible devices and joystick devices, said interface device comprising:
   a MIDI-In connector;
   a MIDI-Out connector;
   a MIDI-Thru connector;
   a plurality of joystick connectors;
   a first connector having MIDI interface signals and joystick signals defined therein; and
   a shielded multi-conductor cable for carrying said MIDI interface signals and said Joystick signals, said cable having a first end and second end, said first end attached to said first connector;
   a circuit board having a ground plane with substantially all corners of said ground plane formed at angles greater than 90 degrees, said circuit board affixed to said MIDI-In connector, said MIDI-Out connector, said MIDI-Thru connector, said joystick connectors and said second end of said multi-conductor cable at affixation points.

2. The interface device as recited in claim 1, wherein said ground plane completely circumscribes said affixation points at which said joystick connectors are affixed to said circuit board.

3. The interface device as recited in claim 2, wherein a portion of said ground plane is disposed intermediate said affixation points for said joysticks and affixation points for said MIDI connectors on said circuit board.

4. The interface device as recited in claim 1 further comprising:
   an isolation circuit disposed on said circuit board for electrically isolating said MIDI-In connector from said MIDI interface signals in said multi-conductor cable; and
   an enclosure having shielding properties for shielding electrical emissions enclosing said circuit board.

5. The interface device as recited in claim 4, further comprising electrical circuitry and a ground plane disposed on said circuit board and shielding said electrical circuitry, thereby reducing electrical emissions.

6. The interface device as recited in claim 5, wherein said ground plane of said circuit board is electrically connected to said enclosure.

7. An interface device for connecting a plurality of computer lines to a single computer port comprising:
   a first and a second connector for carrying respectively a first type of signal for a first computer line and a second type of signal for a second computer line;
   a third connector for carrying both the first and second type of signal;
   a circuit board having a plurality of conductive paths thereon connected to the first, second and third connectors wherein connection points for the first and second type of signal are respectively localized in a first and second region of the board and a ground plane substantially surrounds the first region and separates the first region from the second region, said conductive paths and said ground plane defined by boundaries wherein corners of said boundaries form angles greater than 90 degrees; and
   a shielded multiconductor cable for carrying both the first and second type of signals, the cable for connection between the third connector and the computer port.

8. The interface device as recited in claim 7 wherein the ground plane is electrically coupled to a shield in the shielded multiconductor cable.

9. The interface device as recited in claim 8 wherein the ground plane substantially surrounds the second region.

10. The interface device as recited in claim 7 further comprising an enclosure having shielding properties for shielding electrical emissions, the enclosure enclosing the circuit board and having the first, second and third connectors mounted thereto.

11. The interface device as recited in claim 10 wherein the ground plane of the board is electrically connected to the enclosure.

12. An interface device for connecting a plurality of computer lines to a single computer port comprising:
   a first and a second connector for respectively carrying a first type of signal for a first computer line and a second type of signal for a second computer line;
   a third connector for carrying both the first and second type of signal;
   a circuit board having a plurality of conductive paths thereon connected to the first, second and third connectors wherein connection points for the first and second type of signal are respectively localized in a first and second region of the board and a ground plane substantially surrounds the first region said conductive paths and said ground plane defined by boundaries wherein substantially all corners of said boundaries are angles greater than 90 degrees; and
   a shielded multiconductor cable for carrying both the first and second type of signals, the cable for connection between the third connector and the computer port when connected the cable having a cable shield electrically coupled to the ground plane.

13. The interface device as recited in claim 12 wherein the ground plane separates the first and second regions.

14. The interface device as recited in claim 12 further comprising an enclosure having shielding properties for shielding electrical emissions, the enclosure enclosing the circuit board and having the first, second and third connectors mounted thereto.

15. The interface device as recited in claim 14 wherein the ground plane of the board is electrically connected to the enclosure.

* * * * *